(12) United States Patent
Oh et al.

(10) Patent No.: US 10,319,416 B2
(45) Date of Patent: Jun. 11, 2019

(54) MEMORY DEVICE INCLUDING PAGE BUFFERS

(71) Applicant: SK hynix Inc., Gyeonggi-do (KR)

(72) Inventors: Sung-Lae Oh, Chungcheongbuk-do (KR); Dong-Hyuk Kim, Seoul (KR); Soo-Nam Jung, Seoul (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 15/792,992

(22) Filed: Oct. 25, 2017

(65) Prior Publication Data

US 2019/0013050 A1    Jan. 10, 2019

(30) Foreign Application Priority Data

Jul. 5, 2017  (KR) .......................... 10-2017-0085294

(51) Int. Cl.
*G11C 5/02*  (2006.01)
*G11C 7/10*  (2006.01)
*G11C 5/06*  (2006.01)

(52) U.S. Cl.
CPC ................ *G11C 5/025* (2013.01); *G11C 5/06* (2013.01); *G11C 7/10* (2013.01)

(58) Field of Classification Search
CPC .............. G11C 5/025; G11C 7/10; G11C 5/06
USPC ........................................ 365/51, 63, 189.08
See application file for complete search history.

(56) References Cited

U.S. PATENT DOCUMENTS

| | | | | |
|---|---|---|---|---|
| 8,837,193 | B2* | 9/2014 | Oh .......................... | G11C 5/025 |
| | | | | 365/185.12 |
| 9,965,388 | B2* | 5/2018 | Chun ................... | G06F 12/0802 |
| 10,062,765 | B2* | 8/2018 | Oh .......................... | H01L 29/517 |
| 2006/0181928 | A1* | 8/2006 | Lee ..................... | G11C 16/0483 |
| | | | | 365/185.22 |
| 2013/0132644 | A1* | 5/2013 | Choi .................... | G06F 12/0246 |
| | | | | 711/103 |
| 2015/0055421 | A1* | 2/2015 | Lim ...................... | G11C 7/1039 |
| | | | | 365/189.05 |

FOREIGN PATENT DOCUMENTS

KR   1020140123135   10/2014
KR   1020160146287   12/2016

* cited by examiner

*Primary Examiner* — Viet Q Nguyen
(74) *Attorney, Agent, or Firm* — IP & T Group LLP

(57) ABSTRACT

A memory device includes a memory cell array; bit lines including even and odd bit lines extending in a first direction and alternately disposed; cache latches including even cache latches which exchange data with the memory cell array through the even bit lines and odd cache latches which exchange data with the memory cell array through the odd bit lines; $2^k$ data lines, where k is a natural number equal to or greater than 2, respectively corresponding to $2^k$ input/output pins; and column merge units respectively allocated to the input/output pins, and each suitable for coupling any one of the even cache latches or any one of the odd cache latches to a data line corresponding to an input/output pin to which it is allocated. A pitch of the column merge units in a second direction intersecting the first direction is greater than a pitch of the cache latches.

20 Claims, 14 Drawing Sheets

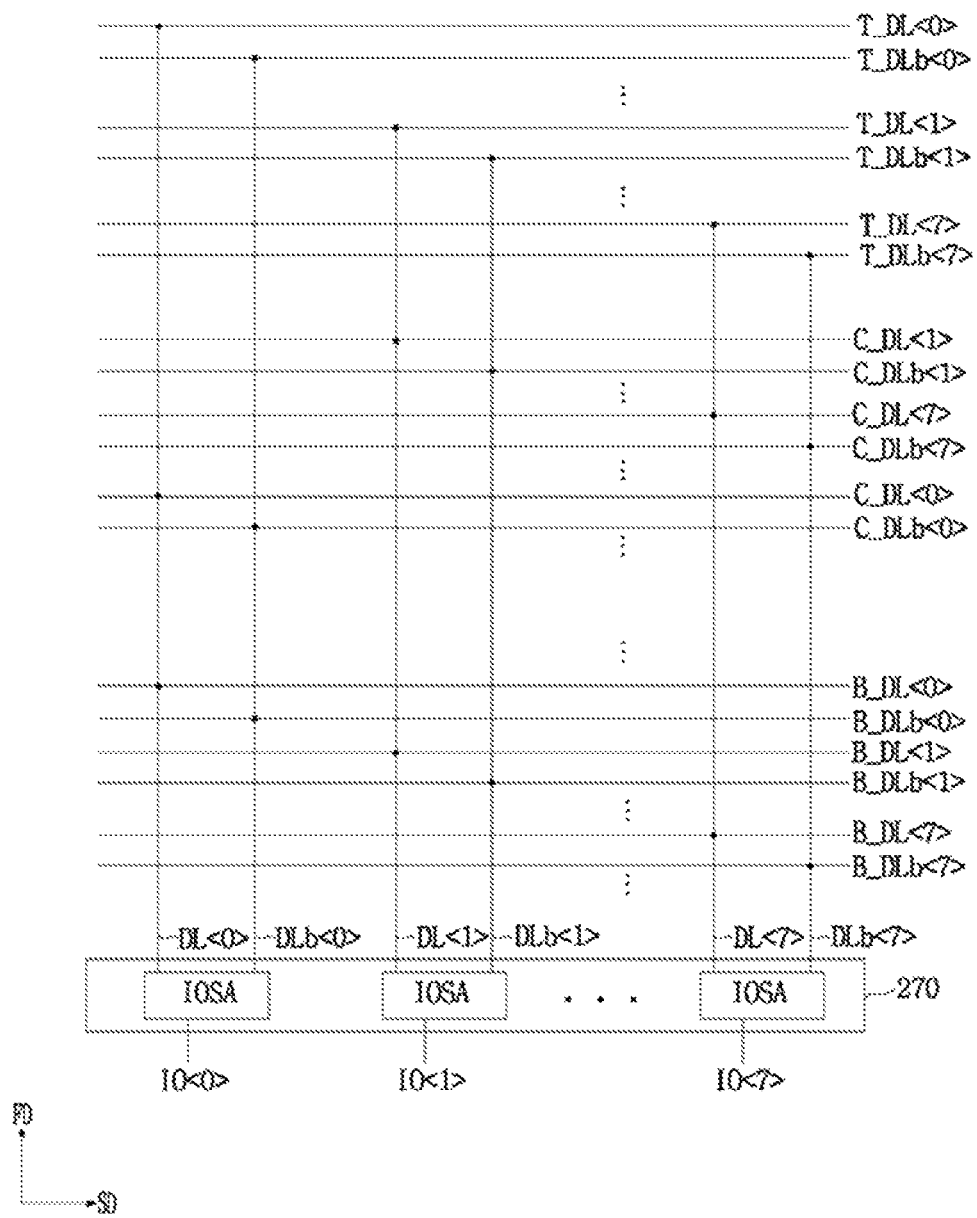

MEMORY DEVICE INCLUDING PAGE BUFFERS

CROSS-REFERENCE TO RELATED APPLICATION

The present application claims priority to Korean Patent Application No. 10-2017-0085294 filed on Jul. 5, 2017, which is herein incorporated by reference in its entirety.

BACKGROUND

1. Technical Field

Various embodiments generally relate to a memory device, and, more particularly, to a memory device including page buffers.

2. Related Art

In a volatile memory device, while write and read speeds are high, stored data are lost when a power supply is interrupted. In a nonvolatile memory device, while write and read speeds are relatively low, stored data are retained even though the power supply is interrupted. Therefore, in order to store data which should be retained regardless of power supply, a nonvolatile memory device is used. Nonvolatile memory devices include a read only memory (ROM), a mask ROM (MROM), a programmable ROM (PROM), an erasable programmable ROM (EPROM), an electrically erasable programmable ROM (EEPROM), a flash memory, a phase change random access memory (PRAM), a magnetic RAM (MRAM), a resistive RAM (RRAM), and an ferroelectric RAM (FRAM). A flash memory is classified into a NOR type and a NAND type.

Among nonvolatile memory devices, a NAND flash memory device is widely used as a data storage device. The NAND flash memory device performs operations necessary to read and output data stored in memory cells, by using a plurality of page buffers.

SUMMARY

In an embodiment, a memory device may include: a memory cell array; bit lines including a plurality of even bit lines and a plurality of odd bit lines which extend in a first direction and are alternately disposed; cache latches including a plurality of even cache latches which exchange data with the memory cell array through the even bit lines and a plurality of odd cache latches which exchange data with the memory cell array through the odd bit lines; $2^k$ number of data lines, where k is a natural number equal to or greater than 2, respectively corresponding to $2^k$ number of input/output pins; and a plurality of column merge units respectively allocated to the input/output pins, and each suitable for coupling any one of the even cache latches or any one of the odd cache latches to a data line corresponding to the allocated input/output pin. A pitch of the column merge units in a second direction intersecting the first direction may be greater than a pitch of the cache latches.

In an embodiment, a memory device may include: a memory cell array; a plurality of bit lines coupled to the memory cell array and including a plurality of even bit lines and plurality of odd bit lines, which extending in a first direction and are alternately disposed; $2^k$ k is a natural number equal to or greater than 2 number of data lines where k is a natural number equal to or greater than 2, respectively corresponding to $2^k$ number of input/output pins; an even cache latch group including $2^k$ number of cache latches which are respectively coupled to $2^k$ number of the even bit lines and are respectively allocated to the input/output pins; an odd cache latch group including $2^k$ number of cache latches which are respectively coupled to $2^k$ number of the odd bit lines and are respectively allocated to the input/output pins; and a plurality of column merge units respectively allocated to the input/output pins, and suitable for coupling the $2^k$ number of cache latches included in the even cache latch group or the $2^k$ number of cache latches included in the odd cache latch group, to the data lines, in response to column select signals. The cache latches of the even cache latch group and the odd cache latch group may have a two-dimensional arrangement in the first direction and a second direction intersecting the first direction. A pitch of the column merge units in the second direction may be greater than a pitch of the cache latches in the second direction.

BRIEF DESCRIPTION OF THE DRAWINGS

FIG. 11 is a diagram describing data output paths in accordance with an embodiment of the present invention.

DETAILED DESCRIPTION

Hereinafter, a memory device including page buffers will be described below with reference to the accompanying drawings through various examples of embodiments.

Figure 1:
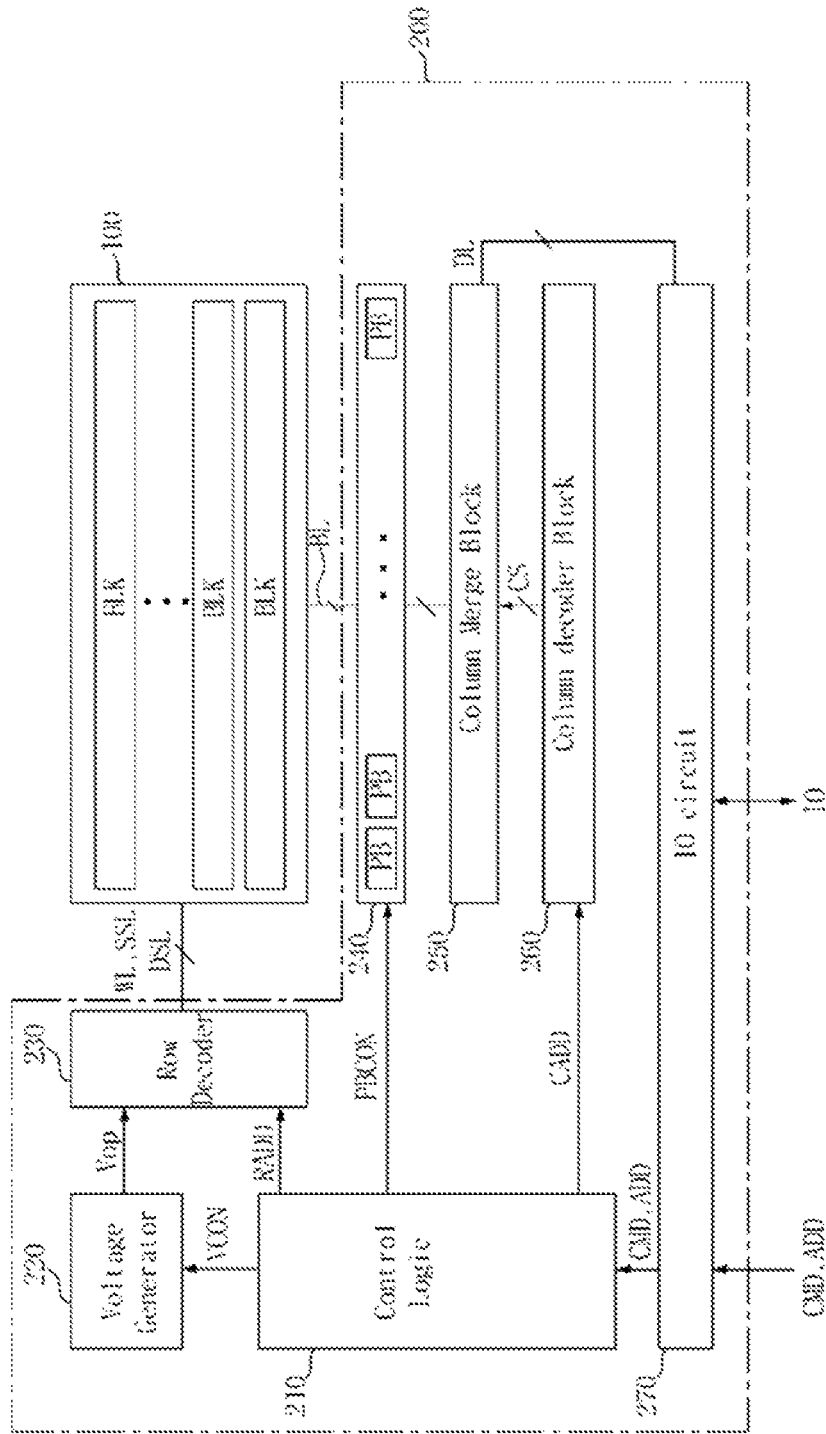
FIG. 1 is a block diagram illustrating a memory device n accordance with an embodiment of the present invention.

FIG. 1 is a block diagram illustrating a memory device in accordance with an embodiment of the present invention.

Referring to FIG. 1, the memory device in accordance with the embodiment may include a memory cell array 100 and a peripheral circuit 200. The peripheral circuit 200 may include a control logic 210, a voltage generator 220, a row decoder 230, a page buffer block 240, a column merge block 250, a column decoder block 260, and an input/output circuit 270.

The memory cell array 100 may include a plurality of memory cells. The memory cell array 100 may be configured as a three-dimensional memory array of a type in which the memory cells are stacked in a direction perpendicular to a substrate.

The memory cell array 100 may be coupled to the row decoder 230 through word lines WL and select lines DSL and SSL. The select lines DSL and SSL may include a drain select line DSL and a source select line SSL. The memory cell array 100 may be coupled to the page buffer block 240 through bit lines BL. The memory cell array 100 may store data inputted through the page buffer block 240 in a program operation and may transmit stored data to the page buffer block 240 in a read operation.

The memory cell array 100 may include a plurality of memory blocks BLK. Memory block BLK may be an erase unit. Word lines WL, select lines DSL and SSL, and bit lines BL may be coupled to the respective memory blocks BLK. Word lines WL and select lines DSL and SSL, may be coupled to each of the memory blocks BLK. Bit lines BL may be coupled in common to the plurality of memory blocks BLK. Descriptions for the memory blocks BLK will be made below with reference to FIG. 2.

The control logic 210 may be configured to output a voltage control signal VCON for generating voltages necessary for the operation of the memory device, in response to a command CMD inputted through the input/output circuit 270. The control logic 210 may be configured to output a page buffer control signal PBCON for controlling page buffers PB included in the page buffer block 240, in response to the command CMD. The control logic 210 may be configured to output a row address signal RADD and a column address signal CADD in response to an address signal ADD inputted through the input/output circuit 270.

The voltage generator 220 may be configured to generate various operating voltages Vop to be used in a program, read or erase operation, in response to the voltage control signal VCON from the control logic 210. For example, the voltage generator 220 may be configured to generate program voltages, pass voltages, read voltages and erase voltages of various levels, in response to the voltage control signal VCON.

The row decoder 230 may be configured to select one among the memory blocks BLK of the memory cell array 100, in response to the row address signal RADD from the control logic 210. The row decoder 230 may be configured to transfer the operating voltages Vop from the voltage generator 220, to the word lines WL and the select lines DSL and SSL coupled to a selected memory block BLK.

The page buffer block 240 may be coupled to the memory cell array 100 through the bit lines BL. The page buffer block 240 may include a plurality of page buffers PB which are coupled to the bit lines BL, respectively. The page buffers PB may be configured to exchange data with the memory cell array 100 through the bit lines BL and temporarily store data transferred from the memory cell array 100.

The column merge block 250 may be configured to couple each of the page buffers PB to any one of data lines DL in response to a column select signal CS from the column decoder blocks 260.

The column decoder block 260 may be configured to generate the column select signal CS in response to the column address signal CADD from the control logic 210. That is, the column decoder block 260 may generate the column select signal CS in response to the column address signal CADD such that data stored in each of the page buffers PB may be transferred to the input/output circuit 270 through any one of the data lines DL.

The input/output circuit 270 may be configured to transfer the command CMD or the address ADD inputted from outside, to the control logic 210, or exchange data with the page buffers PB through the column merge block 250. The input/output circuit 270 may include a plurality of input/output sense amplifiers which generate data by amplifying the voltages of the data lines DL and output the generated data to an input/output path IO.

The input/output path IO may include $2^N$ (N is a natural number equal to or greater than 2) number of input/output pins. In general, N=3, that is, the input/output path IO may include input/output pins IO<0> to IO<7>.

Figure 2:
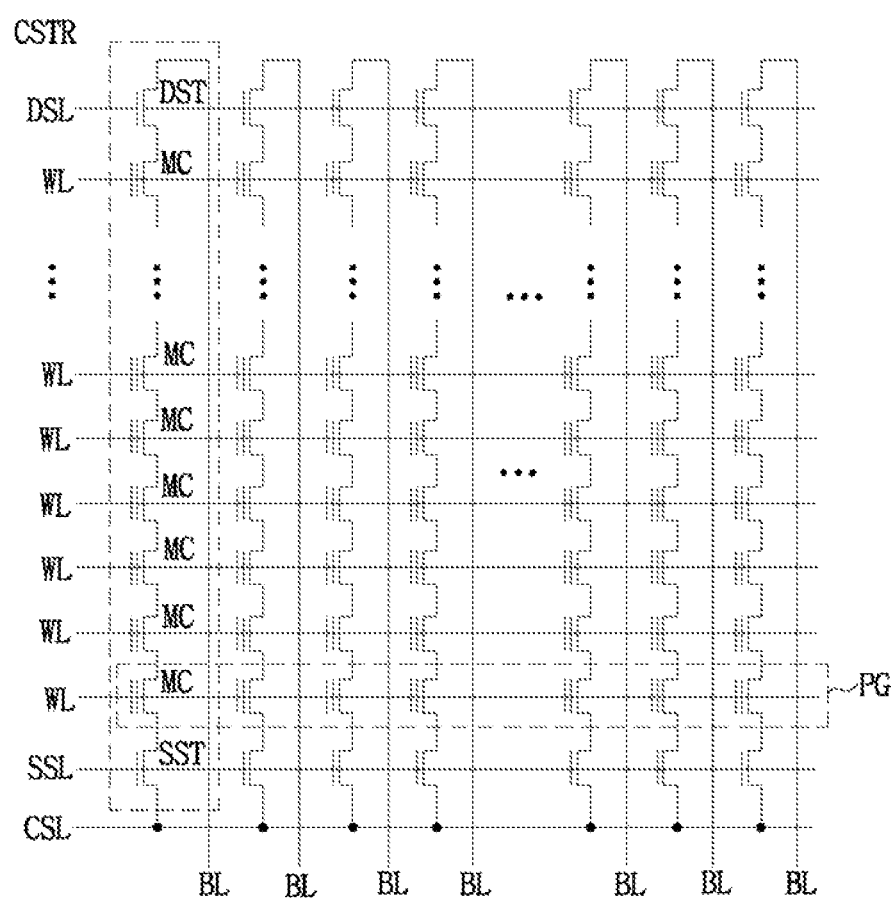
FIG. 2 is an equivalent circuit diagram illustrating one of the memory blocks shown in FIG. 1.

FIG. 2 is an equivalent circuit diagram illustrating one of the memory blocks BLK shown in FIG. 1.

Referring to FIG. 2, the memory block BLK may include a plurality of cell strings CSTR which are coupled between the plurality of bit lines BL and a common source line CSL.

Each of the cell strings CSTR may be coupled between a corresponding bit line BL and the common source line CSL. Each of the cell strings CSTR may include a source select transistor SST which is coupled to the common source line CSL, a drain select transistor DST which is coupled to the bit line BL, and a plurality of memory cells MC which are coupled between the source select transistor SST and the drain select transistor DST. The gate of the source select transistor SST may be coupled to a source select line SSL. The gates of the memory cells MC may be coupled to corresponding word lines WL, respectively. The gate of the drain select transistor DST may be coupled to a drain select line DSL.

The source select line SSL, the word lines WL and the drain select line DSL may be disposed in a direction perpendicular to the bit lines BL. The source select line SSL, the word lines WL and the drain select line DSL may be stacked in a vertical direction on the substrate.

The memory cells MC included in the memory block BLK may be divided into physical page units or logical page units. For example, memory cells MC which share one word line WL and are coupled to different cell strings CSTR may configure one physical page PG. Such a page may be the basic unit of a read operation.

For instance, it is illustrated in FIG. 2 that one drain select transistor DST and one source select transistor SST are provided in each of the cell strings CSTR. However, it is to be noted that two or more drain select transistors or two or more source select transistors may be provided in each of the cell strings CSTR.

Figure 3:
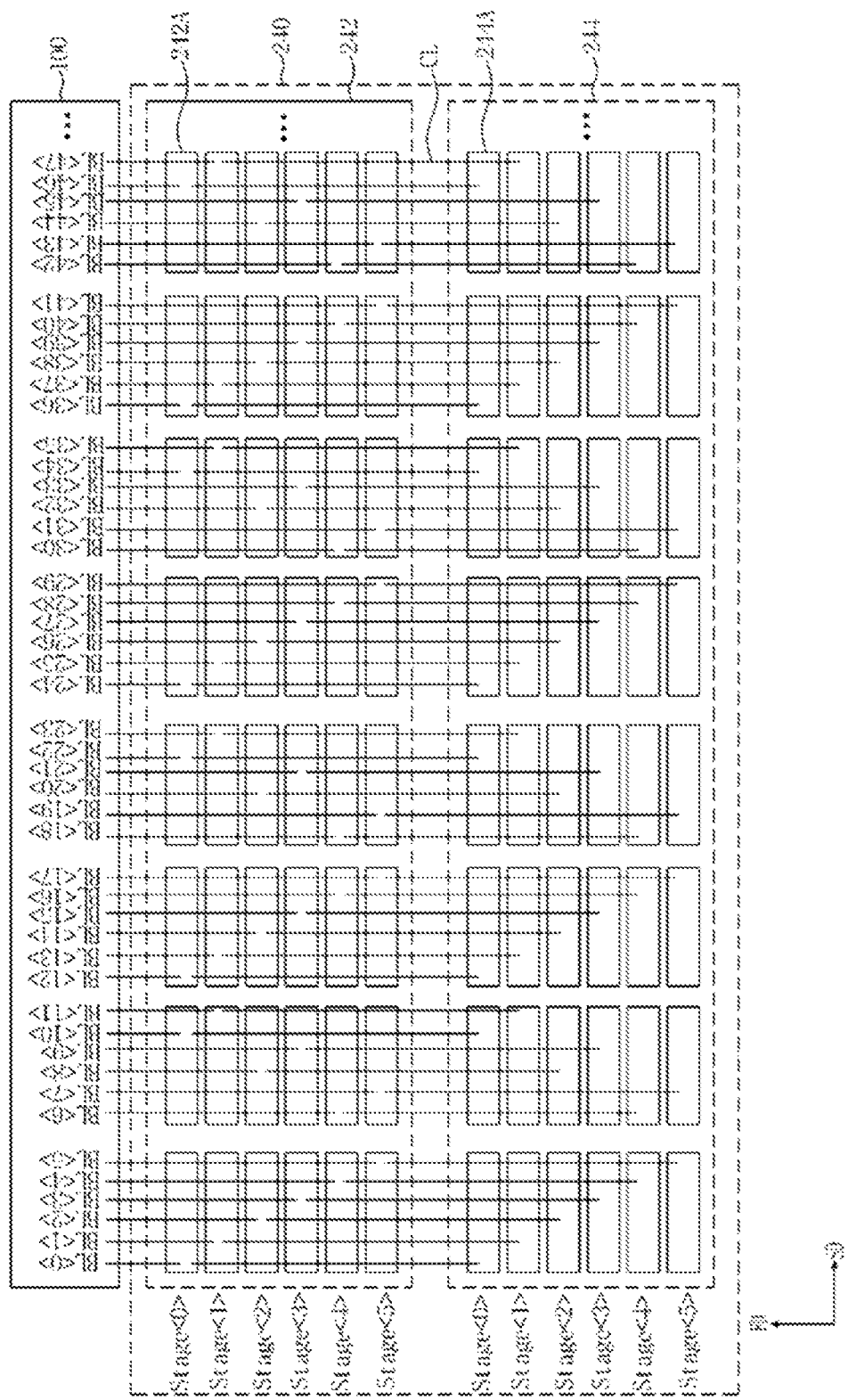
FIG. 3 is a diagram explaining a disposition of page buffers of FIG. 1 and a coupling relationship of the page buffers and bit lines.

FIG. 3 is a diagram describing a disposition of the page buffers PB of FIG. 1 and a coupling relationship of the page buffers PB and the bit lines BL.

Referring to FIG. 3 the page buffer block 240 may include a sensing latch section 242 which includes a plurality of sensing latch circuits 242A and a cache latch section 244 which includes a plurality of cache latches 244A. Each of the page buffers PB may be configured by one of the sensing latch circuits 242A and one of the cache latches 244A.

The sensing latch circuits 242A may be coupled to the cell strings CSTR of the memory cell array 100 through the bit lines BL to exchange data.

Each of the cache latches 244A is coupled to one of the sensing latch circuits 242A through a column line CL and may exchange data with the corresponding sensing latch circuit 242A. In response to a read command inputted to the memory device, data stored in the memory cell array 100 may be read by a sensing latch circuit 242A and be temporarily stored therein, and may then be transmitted to a cache latch 244A through a column line CL and be stored therein. The data stored in the cache latch 244A may be outputted to outside through the input/output path IO via the column merge block 250 and the input/output circuit 270, in response to a data output command inputted from the outside.

The disposition of the sensing latch circuits 242A included in the sensing latch section 242 may have a two-dimensional arrangement in a first direction FD and a second direction SD. The first direction FD indicates a direction parallel to the bit lines BL, and the second direction SD indicates a direction intersecting the first direction FD. In the present embodiment, a case in which the second direction SD is a direction perpendicular to the first direction FD is illustrated. The sensing latch circuits 242A included in the sensing latch section 242 may have an arrangement of M stages in the first direction FD, where M is a natural number which is different from $2^n$ and is equal to or greater than 3, and n is a natural number. For example, the sensing latch circuits 242A included in the sensing latch section 242 may be arranged in six stages Stage<0> to Stage<5> along the first direction FD.

Also the disposition of the cache latches 244A included in the cache latch section 244 may have a two-dimensional arrangement in the first direction FD and the second direction SD. The cache latches 244A included in the cache latch section 244 may have an arrangement of M stages in the first direction FD. For example, the cache latches 244A included in the cache latch section 244 may be arranged in six stages Stage<0> to Stage<5> along the first direction FD.

As the sensing latch circuits 242A and the cache latches 244A are disposed in six stages in the first direction FD parallel to the bit lines BL, the size of the memory device may be reduced when compared to the case in which the sensing latch circuits 242A and the cache latches 244A are disposed in eight stages corresponding to the number of the input/output pins included in the input/output path IO (see FIG. 1), from the viewpoint of input/output of data. Two stages of sensing latch circuits 242A and cache latches 244A which remain from the sensing latch circuits 242A and the cache latches 244A which are disposed in six stages in the first direction FD, are disposed in the second direction SD.

Figure 4:
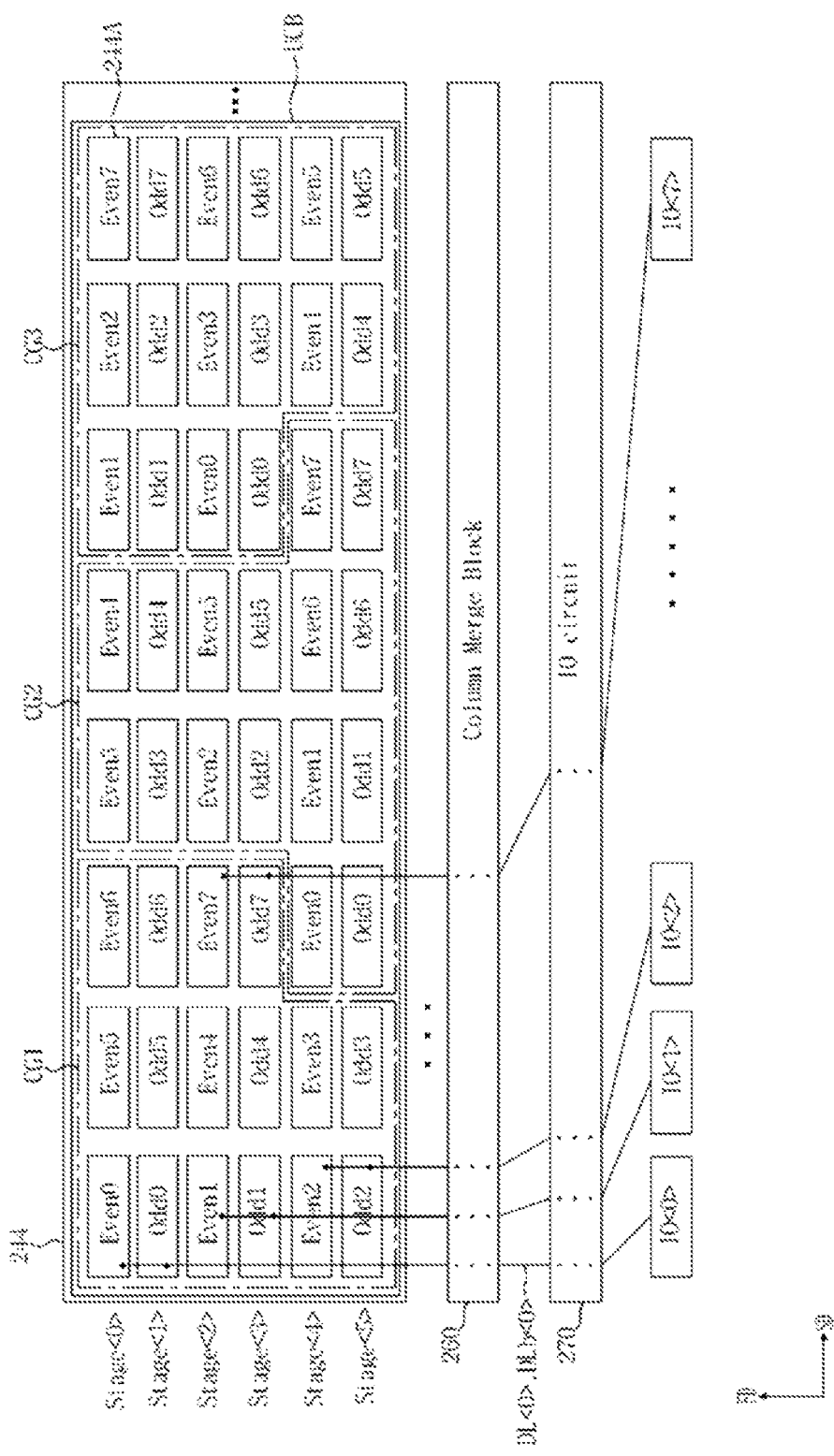
FIG. 4 is a diagram describing an input/output path allocation and column select coding of a cache latch section shown in FIG. 3.

FIG. 4 is a diagram describing an input/output path allocation and column select coding of the cache latch section 244 shown in FIG. 3.

Referring to FIG. 4, unit cache blocks UCB each including 48 cache latches 244A may be disposed repeatedly along the second direction SD. The input/output path IO may be configured by eight input/output pins IO<0> to IO<7>.

FIG. 4 illustrates that respective cache latches 244A are allocated to which input/output pins among the eight input/output pins IO<0> to IO<7> and thereby receive and output data. When an even cache latch coupled to an even bit line is numbered as 'Even#' (# is an integer equal to or greater than 0) and an odd cache latch coupled to an odd bit line is numbered as 'Odd#,' even cache latches Even# may be allocated to the input/output pins IO<0> to IO<7>, respectively, in sequence of increasing number # and thereby exchange data. Odd cache latches Odd# may be allocated to the input/output pins IO<0> to IO<7>, respectively, in sequence of increasing number # and thereby exchange data. For example, when eight even cache latches Even0 to Even7 or eight odd cache latches Odd0 to Odd7 are allocated to the eight input/output pins IO<0> to IO<7>, the eight even cache latches Even0 to Even7 or the eight odd cache latches Odd0 to Odd7 may form one input/output cache latch group.

In FIG. 4, the unit cache blocks UCB may include cache latch groups CG1, CG2 and CG3 each of which includes eight even cache latches Even0 to Even7 and eight odd cache latches Odd0 to Odd7.

Eight even cache latches Even0 to Even7 in each of the cache latch groups CG1, CG2 and CG3 may configure one column select coding, and eight odd cache latches Odd0 to Odd7 in each of the cache latch groups CG1, CG2 and CG3 may also configure one column select coding. That is, each of the cache latch groups CG1, CG2 and CG3 may be configured by two column select coding. Data stored in eight cache latches included in one column select coding may be outputted simultaneously in parallel through the column merge block 250 when outputting data.

The disposition of cache latches included in each of the cache latch groups CG1, CG2 and CG3 does not define a complete rectangular form but defines an incomplete rectangular form, for example, an octahedral form. This is due to the fact that the disposition of cache latches has an arrangement of six total stages in the first direction FD and the cache latches are allocated to the input/output pins IO<0> to IO<7> in sequence of increasing number in the first direction FD.

A pair of one even cache latch and one odd cache latch, which is included in the same cache latch group and is allocated to the same input/output pin as the one even cache latch, may be disposed in adjacent stages, respectively, in the first direction FD.

The even cache latches disposed in the stage Stage<0> include cache latches which are coupled to the input/output pins IO<0> to IO<7> respectively. The even cache latches disposed in the stage Stage<0> include cache latches which are included in the plurality of cache latch groups CG1, CG2 and CG3. This applies the same to the stages Stage<1> to Stage<5>.

The disposition of cache latches in six total stages in the first direction FD parallel to the bit lines BL may reduce the size of the memory device by reducing the layout area of the page buffer block 240 when compared to, for example, the disposition of cache latches in total eight stages in one of the first direction FD and the second direction SD. However, due to the fact that cache latches included in one stage are allocated to a plurality of input/output pins, the disposition of cache latches in six total stages requires an input/output patch configuration that is different from the disposition of cache latches in total eight stages.

The unit cache block UCB has a two-dimensional arrangement of a rectangular form. The disposition of such a rectangular form is defined when the three cache latch groups CG1, CG2 and CG3 are disposed adjacently. A minimum number of cache latch groups of which cache latch disposition defines a rectangular form in a two-dimensional arrangement is referred to as a unit cache block. In the cache latch disposition in which cache latches are arranged in six total stages in the first direction FD parallel to the bit lines BL and the input/output pins IO<0> to IO<7> are allocated in sequence of increasing number in the first direction FD, a group of 48 cache latches becomes a unit cache block.

In the cache latch disposition in which cache latches are arranged in six total stages in the first direction FD parallel to the bit lines BL and the input/output pins IO<0> to IO<7> are allocated in sequence of increasing number in the first direction FD, eight cache latches configuring one column select coding are not disposed in one stage in the first direction FD or in one stage in the second direction SD, but are disposed in a plurality of stages in each of the first direction FD and the second direction SD. That is, it may be seen that the even cache latches Even0 to Even7 of each of the cache latch groups CG1, CG2 and CG3 are distributed over three stages, for example, the stages Stage<0>, Stage<2> and Stage<4>, in the first direction FD, and over three or four stages in the second direction SD. The odd cache latches Odd0 to Odd7 in each of the cache latch groups CG1, CG2 and CG3 are distributed similarly to the even cache latches Even0 to Even7.

Referring to FIGS. 3 and 4, the bit lines coupled to the even cache latches Even0 to Even7 in each of the cache latch groups CG1, CG2 and CG3 and the bit lines coupled to the odd cache latches Odd0 to Odd7 in each of the cache latch groups CG1, CG2 and CG3 are alternately disposed one by one. For example, the bit line BL<0> coupled to the cache latch Even0 in the first cache latch group CG1 and the bit line BL<1> coupled to the cache latch Odd0 in the first cache latch group CG1 are disposed adjacent to each other, and the bit line BL<2> coupled to the cache latch Even1 in the first cache latch group CG1 and the bit line BL<3> coupled to the cache latch Odd1 in the first cache latch group CG1 are disposed adjacent to each other.

Bit lines BL which are coupled to cache latches included in the same cache latch group are disposed adjacent to one another. This is due to the fact that cache latches are arranged in six total stages in the first direction FD and the input/output pins IO<0> to IO<7> are allocated in sequence of increasing number in the first direction FD.

In a read operation of reading the data stored in the page PG (see FIG. 2), even bit lines coupled to even cache latches and odd bit lines coupled to odd cache latches may be enabled at a time to perform reading. In this case, if the number of memory cells configuring one page is 8 Kbytes, data of 8 Kbytes is read at a time. In another embodiment, only bit lines coupled to any ones of even cache latches and odd cache latches may be enabled at a time to perform reading. In this case, if the number of memory cells configuring one page is 8 Kbytes, data of 4 Kbytes is read at a time. In this regard, unselected bit lines of even bit lines and odd bit lines, on which the read operation is not performed, may retain a ground voltage (GND) while selected bit lines are enabled, thereby reducing the noise generated during the read operation. As a result, in the case of performing the read operation by enabling any ones of even bit lines and odd bit lines quick read performance may be achieved when compared to the case in which the read operation is performed by enabling both the even bit lines and the odd bit lines at a time.

In a memory device failures may occur in certain bit lines by impurity particles produced in a manufacturing procedure or the like. When a read operation is performed, fail data may be transmitted to cache latches coupled to the bit lines in which process failures occur, resulting in read errors. In order to prevent such read errors, redundant cache latches for repairing cache latches in which fail data are loaded may be disposed in the memory device. By replacing the cache latches in which fail data are loaded with the redundant cache latches during the read operation, the data stored in the failed cache latches may not be outputted, but the data stored in the redundant cache latches which replace the failed cache latches may be outputted. This operation is referred to as column repair. Moreover, a case in which a plurality of bit lines positioned at close distances fail due to impurity particles produced in a manufacturing procedure or the like may occur. In this case, column repair may be performed on a plurality of cache latches in order to improve the efficiency of failed cache latch repair. The bundle of cache latches to be replaced with redundant cache latches in this way is referred to as a redundant cache latch unit. Such a redundant cache latch unit may be implemented in such a way that, if one bit line coupled to any cache latch in a cache latch group fails, cache latches in the corresponding cache latch group are replaced together with redundant cache latches. In the case of a memory device which is configured by eight input/output pins, if one cache latch fails, 16 cache latches in a cache latch group including the failed cache latch may be replaced together with redundant cache latches.

Figure 5:
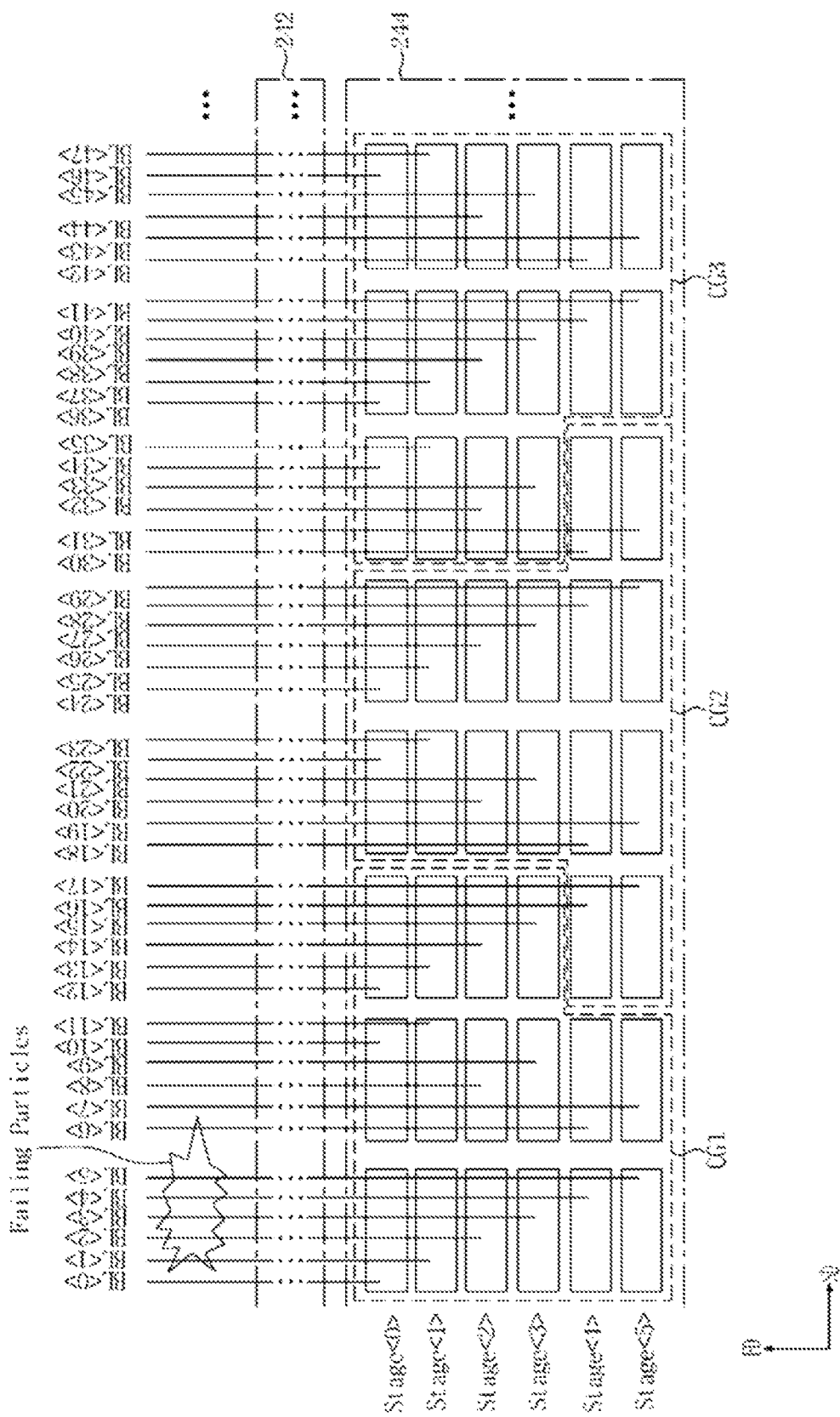
FIGS. 5 and 6 are diagrams describing a failed cache latch repair method in accordance with an embodiment of the present invention.
Figure 6:
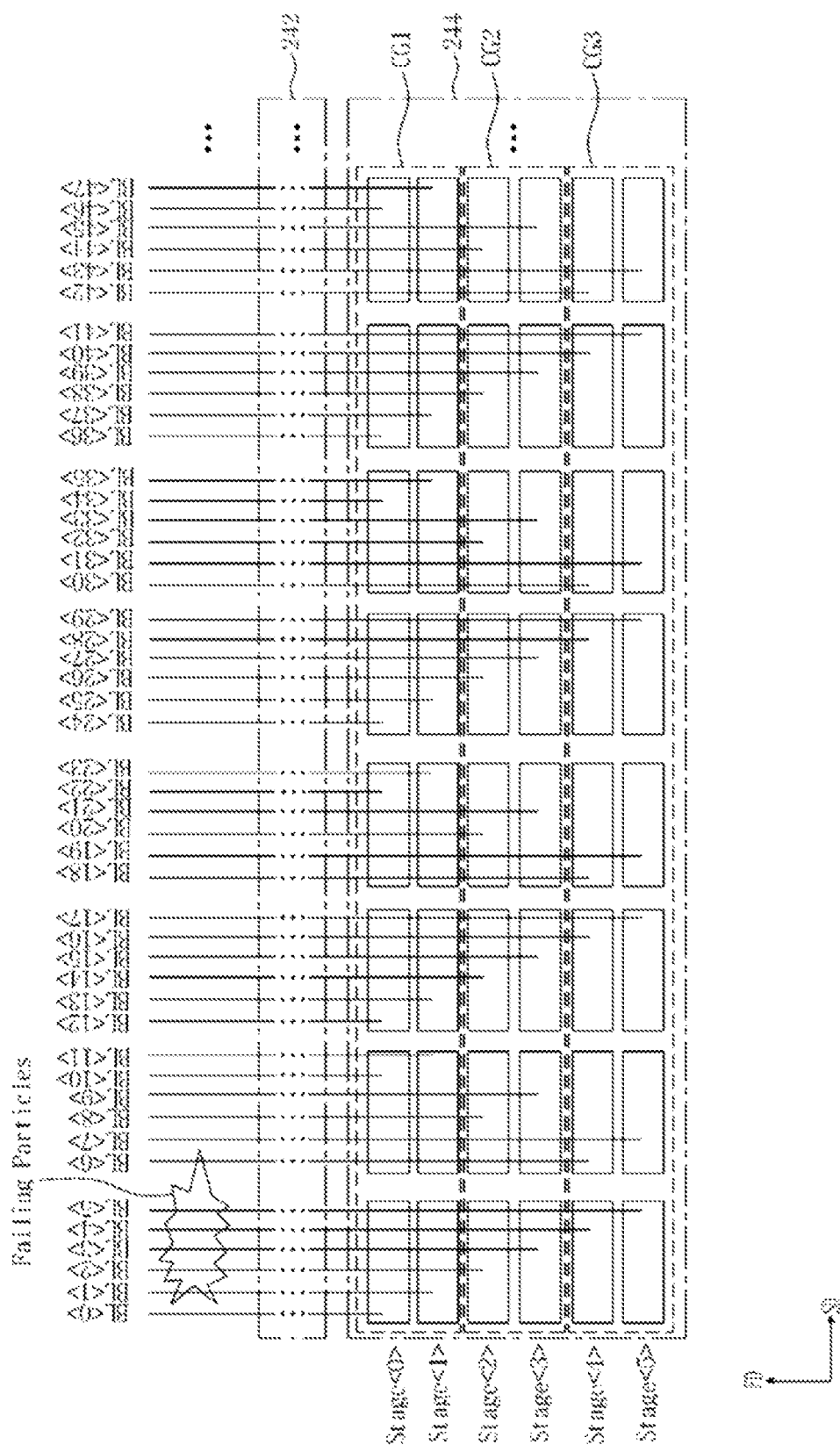

FIGS. 5 and 6 are diagrams describing a failed cache latch repair method in accordance with an embodiment of the present invention. FIG. 5 shows a failed cache latch repair method according to an embodiment of the present invention, and FIG. 6 shows a failed cache latch repair method according to a comparative method.

Referring to FIG. 5, as failing particles occur, the bit lines BL<1> to BL<6> may become failed bit lines all at once. Since the bit lines BL<1> to BL<6> are coupled with cache latches of the first cache latch group CG1, read errors may be solved by replacing the 16 cache latches in the first cache latch group CG1 with redundant cache latches.

Referring to FIG. 6, illustrates an example unlike the present embodiment, in which eight cache latches included in one column select coding are disposed in one stage in the first direction FD.

As failing particles occur, the bit lines BL<1> to BL<6> may become failed bit lines all at once. Since the bit line BL<1> is coupled to a cache latch of the first cache latch group CG1, the bit lines BL<2> and BL<3> are coupled to cache latches of the second cache latch group CG2 and the bit lines BL<4> to BL<6> are coupled to cache latches of the third cache latch group CG3, read errors may be solved by replacing the 48 cache latches of the first, second, and third cache latch groups CG1, CG2 and CG3 with redundant cache latches. This means that read errors may be solved only when more cache latches are replaced with redundant cache latches even though the number of failed bit lines is the same, when compared to the case described above with reference to FIG. 5. Namely, when compared to the case of FIG. 6 in which eight cache latches included in one column select coding are disposed in one stage in the first direction FD, repair efficiency may be improved by the present embodiment in which cache latches are disposed in both the first direction FD and the second direction SD.

Figure 7:
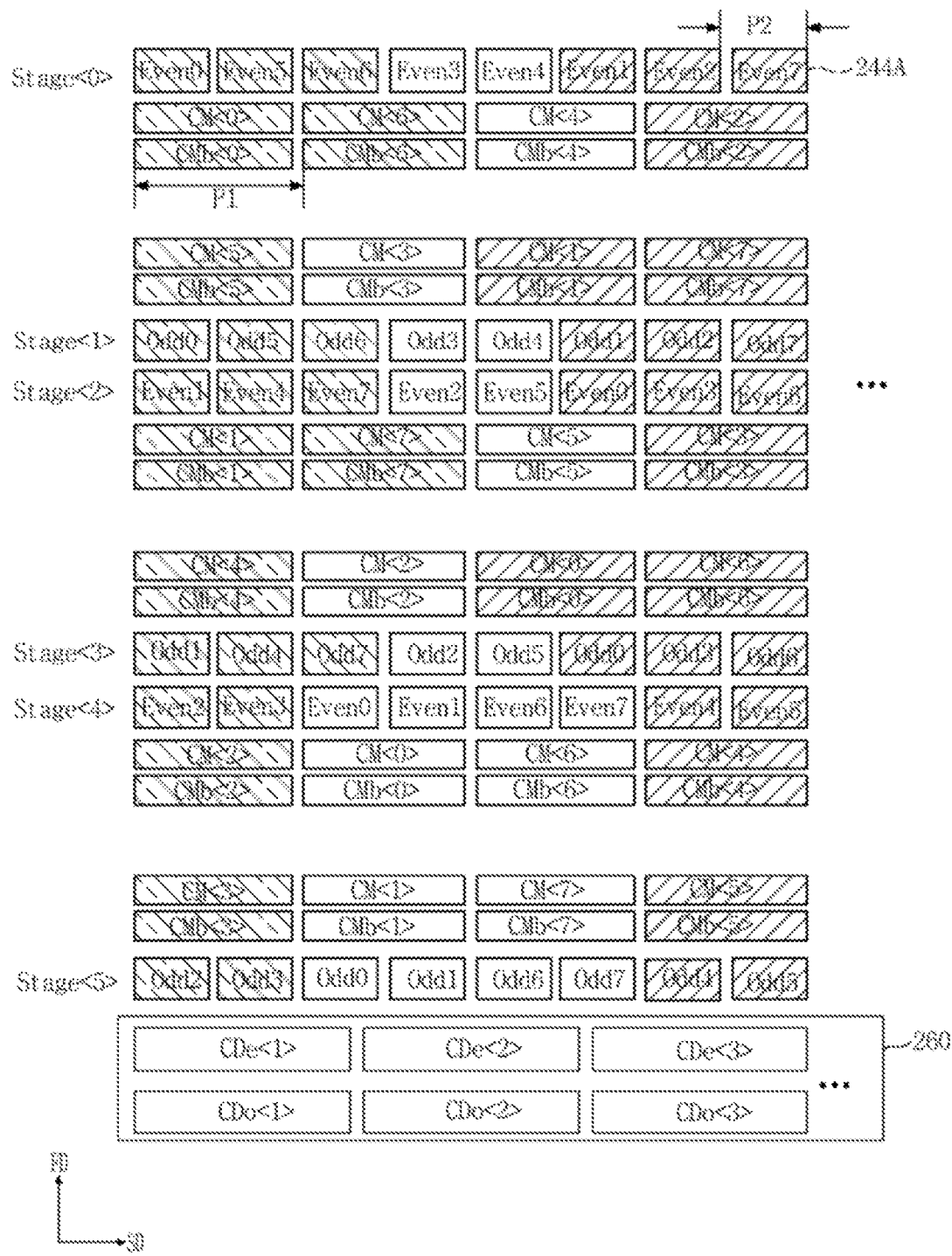
FIG. 7 is a diagram describing a disposition of column merge units and column decoders in accordance with an embodiment of the present invention.
Figure 8:
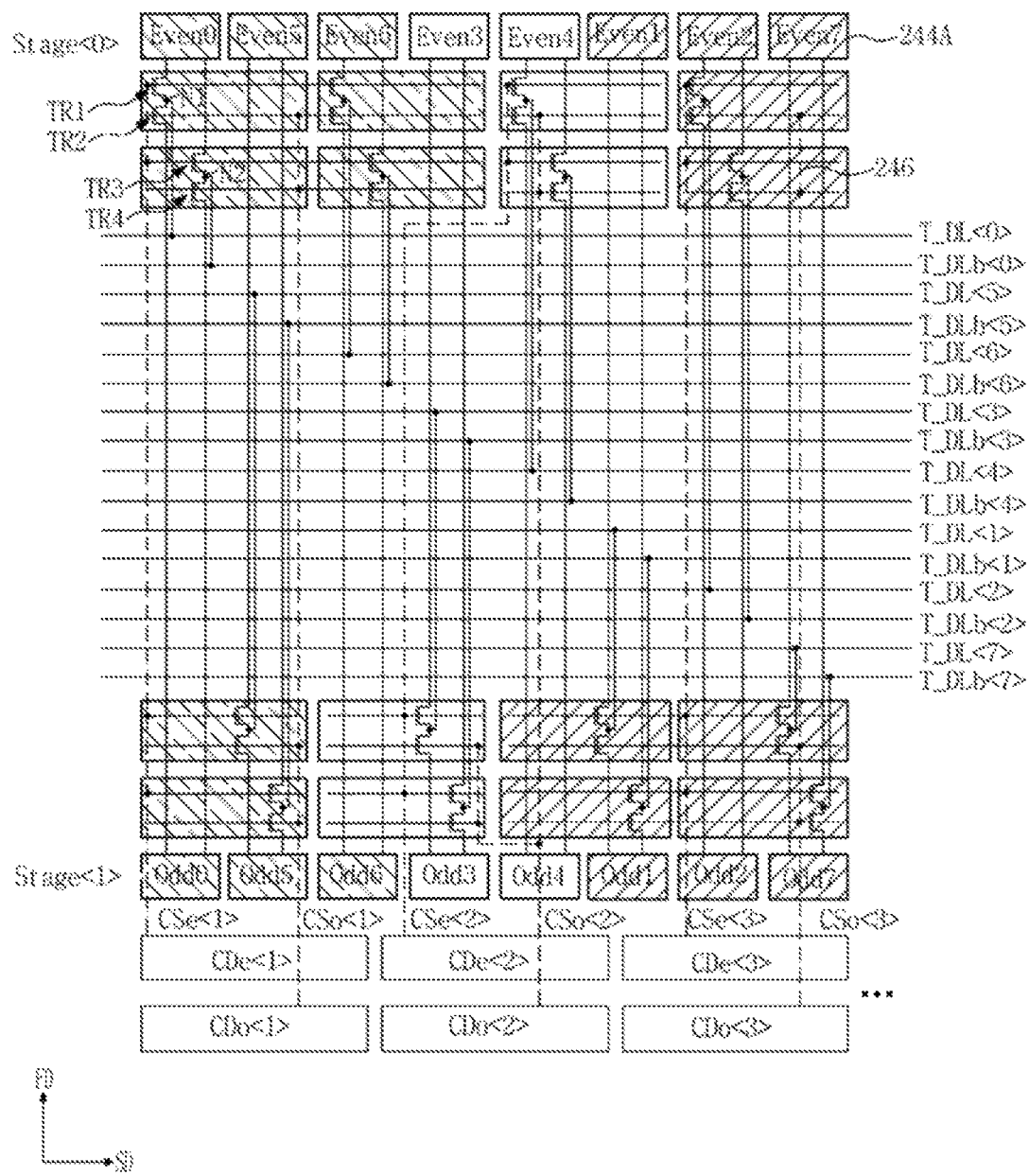
FIG. 8 is a diagram describing the column merge units and column decoders coupled to cache latches disposed in stages shown in FIG. 7.
Figure 9:
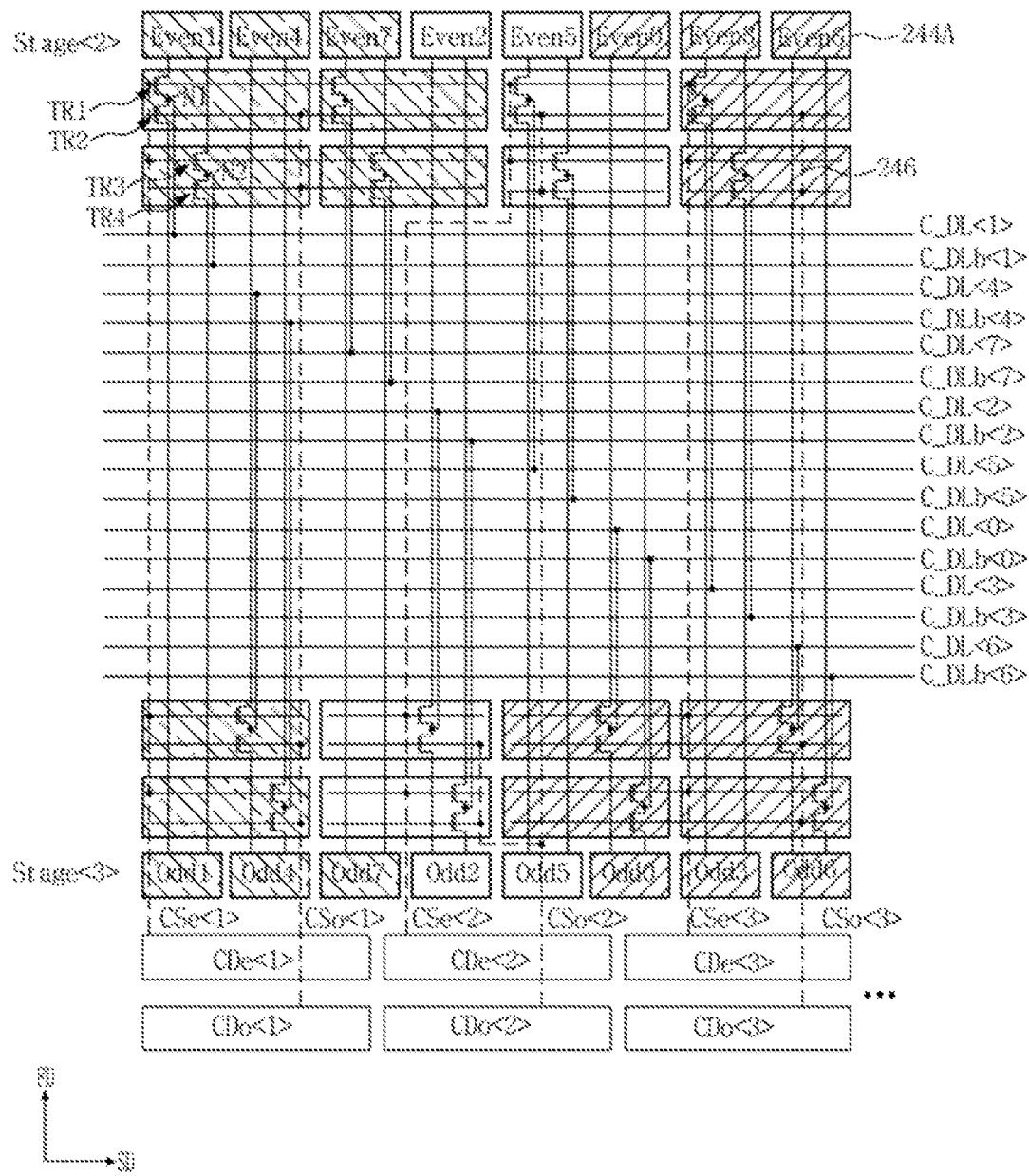
FIG. 9 is a diagram describing the column merge units and column decoders coupled to the cache latches disposed in stages shown in FIG. 7.
Figure 10:
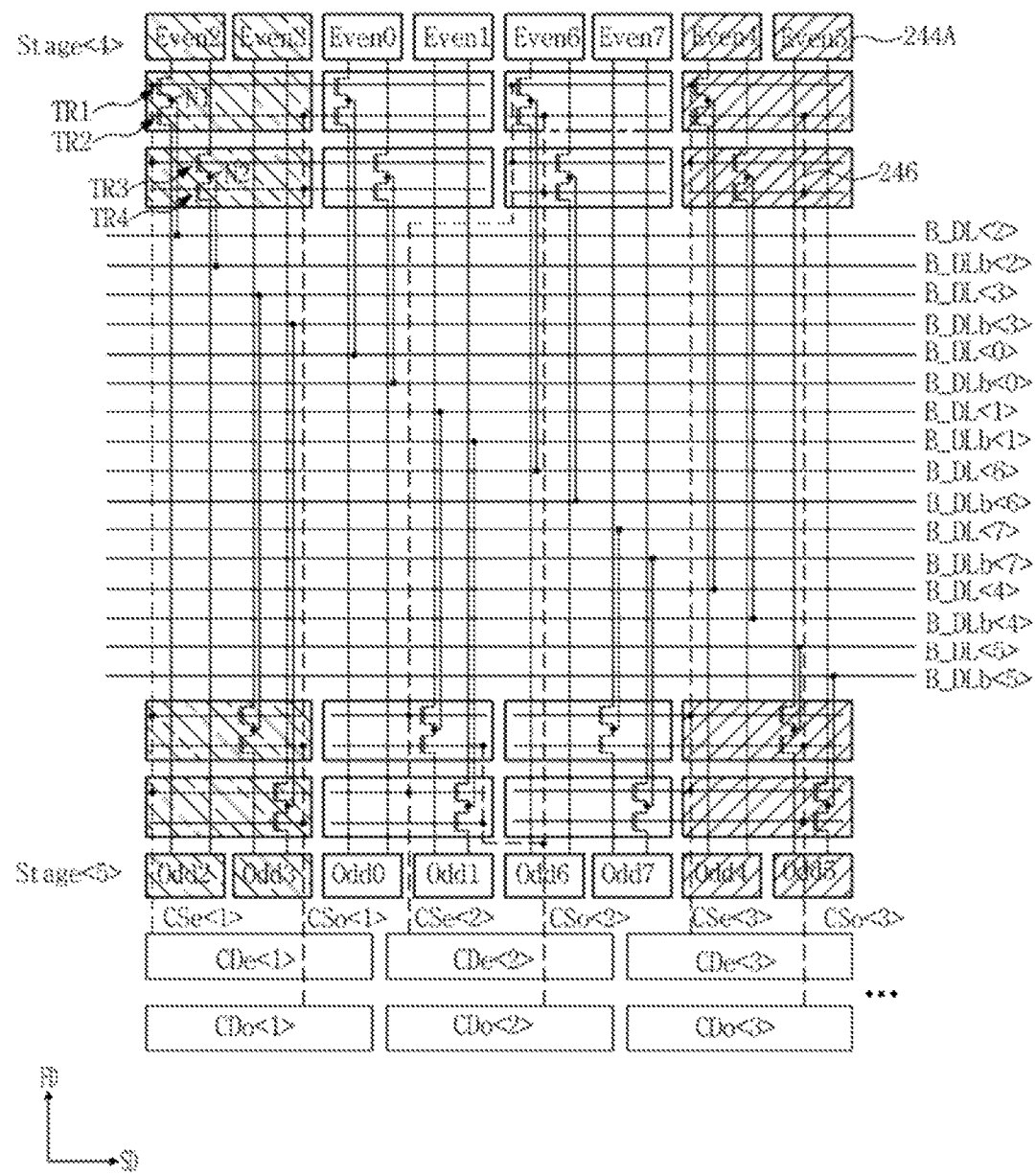
FIG. 10 is a diagram describing the column merge units and column decoders coupled to the cache latches disposed in stages shown in FIG. 7.

FIG. 7 is a diagram describing a disposition of column merge units and column decoders in accordance with an embodiment of the present invention, FIG. 8 is a diagram describing the column merge units and column decoders coupled to the cache latches disposed in stages Stage<0> and Stage<1> in FIG. 7, FIG. 9 is a diagram describing the column merge units and column decoders coupled to the cache latches disposed in stages Stage<2> and Stage<3> in FIG. 7, and FIG. 10 is a diagram describing the column merge units and column decoders coupled to the cache latches disposed in stages Stage<4> and Stage<5> in FIG. 7.

Referring to FIG. 7, the column merge block 250 may include a plurality of column merge units CM. The column merge block 250 may further include a plurality of inverting column merge units CMb which are paired with the column merge units CM. In FIG. 7 and figures following FIG. 7, cache latches are illustrated in different hatches for respective cache latch groups.

FIG. 7 illustrates that the column merge units CM and the inverting column merge units CMb are coupled to the cache latches 244A of cache latch groups.

The column merge units CM and the inverting column merge units CMb may be coupled to the cache latches 244A of cache latch groups which are illustrated in the same hatches.

FIG. 7 illustrates that the column merge units CM and the inverting column merge units CMb output and receive data through input/output pins among the eight input/output pins IO<0> to IO<7>.

Column merge units CM<#>, where # is an integer equal to or greater than 0, may be allocated to the input/output pins IO<0> to IO<7> respectively, in sequence of increasing number # and thereby exchange data. Inverting column merge units CMb<#> may also be allocated to the input/output pins IO<0> to IO<7> respectively, in sequence of increasing number # and thereby exchange data.

Referring to FIGS. 7 to 10, a pair of one even cache latch and one odd cache latch, which is included in the same cache latch group and is allocated to the same input/output pin, may be coupled in common to one column merge unit CM, a pair of one even cache latch and one odd cache latch may be coupled in common to one inverting column merge unit CMb. As is well known, each of the cache latches 244A may have a non-inverted output and an inverted output. Each of the column merge units CM may be coupled between non-inverted outputs of a pair of even cache latch and odd cache latch. Each of the inverting column merge units CMb may be coupled between inverted outputs of a pair of even cache latch and odd cache latch.

A column merge unit CM and an inverting column merge unit CMb, which are coupled in common to a pair of an even cache latch and an odd cache latch, may be disposed adjacent to each other between the pair of the even cache latch and the odd cache latch in the first direction FD.

A pitch of the column merge units CM and the inverting column merge units CMb in the second direction SD is greater than a pitch of the cache latches 244A in the second direction SD. When a pitch of the column merge units CM and the inverting column merge units CMb in the second direction SD is P1 and a pitch of the cache latches 244A in the second direction SD is P2, P1 may be greater than P2. For example, P1 may be two times P2.

The even cache latches disposed in an even-numbered stage include cache latches 244A which correspond to the input/output pins IO<0> to IO<7>, respectively. The odd cache latches disposed in an odd-numbered stage include cache latches 244A which correspond to the input/output pins IO<0> to IO<7>, respectively.

Since an even cache latch of an even-numbered stage and an odd cache latch of an odd-numbered stage, which are disposed to neighbor each other in the first direction FD, share one column merge unit CM column merge units CM, which have the same number as the number of even cache latches disposed in the even-numbered stage or odd cache latches disposed in the odd-numbered stage, may be disposed between the even-numbered stage and the odd-numbered stage which neighbor each other in the first direction FD. Similarly, inverting column merge units CMb, which have the same number as the number of even cache latches disposed in an even numbered stage or odd cache latches disposed in an odd-numbered stage, may be disposed between the even-numbered stage and the odd-numbered stage which neighbor each other in the first direction FD.

Due to the fact that the pitch P1 of the column merge units CM and the inverting column merge units CMb in the second direction SD is greater than the pitch P2 of the cache latches 244A in the second direction SD, column merge units CM coupled to the cache latches 244A disposed in one stage in the first direction FD are not disposed in one stage but are disposed by being distributed over at least two stages in the first direction FD. Moreover, inverting column merge units CMb coupled to the cache latches 244A disposed in one stage in the first direction FD are not disposed in one stage but are disposed by being distributed over at least two stages in the first direction FD. For example, column merge units CM<0> to CM<7> which are coupled to the cache latches Even0 to Even7 disposed in the stage Stage<0> are disposed in two stages in the first direction FD, and inverting column merge units CMb<0> to CMb<7> which are coupled to the cache latches Even0 to Even7 disposed in the stage Stage<0> are disposed in two stages in the first direction FD. Therefore, the number of column merge units CM which are disposed in each stage in the first direction FD is smaller than the number of cache latches 244A which are disposed in each stage in the first direction FD. For example, when eight cache latches are disposed in each stage in the first direction FD, each of the number of column merge units CM disposed in each stage in the first direction FD and the number of inverting column merge units CMb disposed in each stage in the first direction FD may be four.

Each of the column merge units CM may include a first switch transistor TR1 and a second switch transistor TR2 which are coupled in series between the non-inverted output of an even cache latch and the non-inverted output of an odd cache latch which is paired with the even cache latch.

One of even column select signals CSe<1> to CSe<3> may be inputted to a gate of the first switch transistor TR1 from the column decoder block 260 (see FIG. 7), and one of odd column select signals CSo<1> to CSo<3> may be inputted to a gate of the second switch transistor TR2 from the column decoder block 260.

One of data lines DL<0> to DL<7> is coupled to a first node N1 to which the first switch transistor TR1 and the second switch transistor TR2 are coupled in common.

The first switch transistor TR1 may couple the non-inverted output of an even cache latch to one of the data lines DL<0> to DL<7> in response to an even column select signal CSe inputted to the gate thereof, and the second switch transistor TR2 may couple the non-inverted output of an odd cache latch to one of the data lines DL<0> to DL<7> in response to an odd column select signal CSo inputted to the gate thereof.

Each of the inverting column merge units CMb may include a third switch transistor TR3 and a fourth switch transistor TR4 which are coupled in series between the inverted output of an even cache latch and the inverted output of an odd cache latch which is paired with the even cache latch.

One of the even column select signals CSe<1> to CSe<3> may be inputted to a gate of the third switch transistor TR3 from the column decoder block 260, and one of the odd column select signals CSo<1> to CSo<3> may be inputted to a gate of the fourth switch transistor TR4 from the column decoder block 260. One of inverting data lines DLb<0> to DLb<7> is coupled to a second node N2 to which the third switch transistor TR3 and the fourth switch transistor TR4 are coupled in common.

The third switch transistor TR3 may couple the inverted output of an even cache latch to one of the inverting data lines DLb<0> to DLb<7> in response to an even column select signal CSe inputted to the gate thereof, and the fourth switch transistor TR4 may couple the inverted output of an odd cache latch to one of the inverting data lines DLb<0> to DLb<7> in response to an odd column select signal CSo inputted to the gate thereof.

The same even column select signal CSe may be inputted to the gates of the first switch transistor TR1 of the column merge unit CM and the third switch transistor TR3 of the inverting column merge unit CMb, which are coupled between an odd cache latch and an even cache latch paired with each other. Similarly, the same odd column select signal CSo may be inputted to the gates of the second switch transistor TR2 of the column merge unit CM and the fourth switch transistor TR4 of the inverting column merge unit CMb, which are coupled between an odd cache latch and an even cache latch paired with each other.

When column merge units CM coupled to cache latches 244A included in the same cache latch group are disposed adjacent to each other in the second direction SD, the gates of the first switch transistors TR1 included in the adjacently disposed column merge units CM may be coupled in common, and the gates of the second switch transistors TR2 included in the adjacently disposed column merge units CM may be coupled in common. For example, the gate of the first switch transistor TR1 included in the column merge unit CM<0> coupled to the cache latch Even0 in the stage Stage<0> and the gate of the first switch transistor TR1 included in the column merge unit CM<6> coupled to the cache latch Even6 in the stage Stage<0> may be coupled in common. Further, the gate of the second switch transistor TR2 included in the column merge unit CM<0> coupled to the cache latch Even0 in the stage Stage<0> and the gate of the second switch transistor TR2 included in the column merge unit CM<6> coupled to the cache latch Even6 in the stage Stage<0> may be coupled in common.

Similarly, when inverting column merge units CMb coupled to cache latches 244A included in the same cache latch group are disposed adjacent to each other in the second direction SD, the gates of the third switch transistors TR3 included in the adjacently disposed inverting column merge units CMb may be coupled in common, and the gates of the fourth switch transistors TR4 included in the adjacently disposed inverting column merge units CMb may be coupled in common.

Referring to FIG. 8, the even cache latches disposed in the stage Stage<0> may include cache latches which are allocated to the input/output pins IO<0> to IO<7>, respectively, and the odd cache latches disposed in the stage Stage<1> may include cache latches which are allocated to the input/output pins IO<0> to IO<7>, respectively.

Between the stages Stage<0> and Stage<1>, there may be disposed eight column merge units CM and eight inverting column merge units CMb which are allocated to the input/output pins IO<0> to IO<7>, respectively.

The non-inverted outputs of the even cache latches of the stage Stage<0> and the non-inverted outputs of the odd cache latches of the stage Stage<1> may be coupled to eight first local data lines T_DL<0> to T_DL<7> through the column merge units CM disposed between the stages Stage<0> and Stage<1>. Moreover, the inverted outputs of the even cache latches of the stage Stage<0> and the inverted outputs of the odd cache latches of the stage Stage<1> may be coupled to eight first local inverting data lines T_DLb<0> to T_DLb<7> through the inverting column merge units CMb disposed between the stages Stage<0> and Stage<1>.

Referring to FIG. 9, the even cache latches disposed in the stage Stage<2> may include cache latches which are allocated to the input/output pins IO<0> to IO<7> respectively, and the odd cache latches disposed in the stage Stage<3> may include cache latches which are allocated to the input/output pins IO<0> to IO<7>, respectively.

Between the stages Stage<2> and Stage<3>, there may be disposed eight column merge units CM and eight inverting column merge units CMb which are allocated to the input/output pins IO<0> to IO<7>, respectively.

The non-inverted outputs of the even cache latches of the stage Stage<2> and the non-inverted outputs of the odd cache latches of the stage Stage<3> may be coupled to eight second local data lines C_DL<0> to C_DL<7> through the column merge units CM disposed between the stages Stage<2> and Stage<3>. Moreover, the inverted outputs of the even cache latches of the stage Stage<2> and the inverted outputs of the odd cache latches of the stage Stage<3> may be coupled to eight second local inverting data lines C_DLb<0> to C_DLb<7> through the inverting column merge units CMb disposed between the stages Stage<2> and Stage<3>.

Referring to FIG. 10, the even cache latches disposed in the stage Stage<4> may include cache latches which are allocated to the input/output pins IO<0> to IO<7>, respectively, and the odd cache latches disposed in the stage Stage<5> may include cache latches which are allocated to the input/output pins IO<0> to IO<7>, respectively.

Between the stages Stage<4> and Stage<5> there may be disposed eight column merge units CM and eight inverting column merge units CMb which are allocated to the input/output pins IO<0> to IO<7>, respectively.

The non-inverted outputs of the even cache latches of the stage Stage<4> and the non-inverted outputs of the odd cache latches of the stage Stage<5> may be coupled to eight third local data lines B_DL<0> to B_DL<7> through the column merge units CM disposed between the stages Stage<4> and Stage<5>. Moreover, the inverted outputs of the even cache latches of the stage Stage<4> and the inverted outputs of the odd cache latches of the stage Stage<5> may be coupled to eight third local inverting data lines B_DLb<0> to B_DLb<7> through the inverting column merge units CMb disposed between the stages Stage<4> and Stage<5>.

The column decoder block 260 may include a plurality of column decoders CDe<1> to CDe<3> and CDo<1> to CDo<3> corresponding to respective input/output cache latch groups. The respective column decoders CDe<1> to CDe<3> and CDo<1> to CDo<3> may output the column select signals CSe and CSo to the column merge units CM and the inverting column merge units CMb such that the cache latches included in the corresponding input/output cache latch groups may exchange data with the input/output pins. For example, the column decoder CDe<1> may output the even column select signal CSe<1> such that the even cache latches included in an even input/output cache latch group of the cache latch group may exchange data with the input/output pins. The column decoder CDo<1> may output the odd column select signal CSo<1> such that the odd cache latches included in an odd input/output cache latch group of the cache latch group may exchange data with the input/output pins.

Two column decoders CDe and CDo corresponding to an even input/output cache latch group and an odd input/output cache latch group, respectively, of one cache latch group may be disposed in the first direction FD. The column decoders CDe<1> to CDe<3> corresponding to even input/output cache latch groups respectively, included in different cache latch groups may be disposed in the second direction SD. The column decoders CDo<1> to CDo<3> corresponding to odd input/output cache latch groups, respectively, included in different cache latch groups may be disposed in the second direction SD.

One even column select signal CSe and one odd column select signal CSo are transferred to each of the column merge units CM and the inverting column merge units CMb from the column decoders CDe<1> to CDe<3> and CDo<1> to CDo<3>. That is, two column select signals CSe and CSo are transferred to each of the column merge units CM and the inverting column merge units CMb.

Due to the fact that the disposition of cache latches has an arrangement of a six total stages in the first direction FD and the cache latches are allocated to the input/output pins IO<0> to IO<7> in sequence of increasing number in the first direction FD, the column merge units CM and the inverting column merge units CMb are disposed in conformity with such a disposition of the cache latches. That is, column merge units CM and inverting column merge units CMb which are disposed in each stage in the second direction SD may share an even column select signal CSe and an odd column select signal CSo.

For example, all column merge units CM and inverting column merge units CMb which are disposed in the first stage in the second direction SD may share the even column select signal CSe<1> and the odd column select signal CSo<1>. Similarly, all column merge units CM and inverting column merge units CMb which are disposed in the fourth stage in the second direction SD may share the even column select signal CSe<3> and the odd column select signal CSo<3>. Some of column merge units CM and inverting column merge units CMb which are disposed in the second stage in the second direction SD may share the even column select signal CSe<1> and the odd column select signal CSo<1>, and the remainder may share the even column select signal CSe<2> and the odd column select signal CSo<2>. Some of column merge units CM and inverting column merge units CMb which are disposed in the third stage in the second direction SD may share the even column select signal CSe<2> and the odd column select signal CSo<2>, and the remainder may share the even column select signal CSe<3> and the odd column select signal CSo<3>.

FIG. 11 is a diagram describing data output paths in accordance with an embodiment of the present invention.

Referring to FIG. 11, among the first local data lines T_DL<0> to T_DL 7> coupled to the cache latches disposed in the stages Stage<0> and Stage<1>, the second local data lines C_DL<0> to C_DL<7> coupled to the cache latches disposed in the stages Stage<2> and Stage<3> and the third local data lines B_DL<0> to B_DL<7> coupled to the cache latches disposed in the stages Stage<4> and Stage<5>, local data lines corresponding to one input/output pin may be coupled in common to one of the data lines DL before input to one input/output sense amplifier IOSA, and may be coupled to the one input/output sense amplifier IOSA through the one data line DL.

Among the first local inverting data lines T_DLb<0> to T_DLb<7> coupled to the cache latches disposed in the stages Stage<0> and Stage<1> the second local inverting data lines C_DLb<0> to C_DLb<7> coupled to the cache latches disposed in the stages Stage<2> and Stage<3> and the third local inverting data lines B_DLb<0> to B_DLb<7> coupled to the cache latches disposed in the stages Stage<4> and Stage<5>, local inverting data lines corresponding to one input/output pin may be coupled in common to one of the inverting data lines DLb before input to one input/output sense amplifier IOSA, and may be coupled to the one input/output sense amplifier IOSA through the one inverting data line DLb.

The input/output circuit 270 (see FIG. 1) may include a plurality of input/output sense amplifiers IOSA which correspond to the input/output pins IO<0> to IO<7>, respectively, included in the input/output path IO (see FIG. 1).

Each of the input/output sense amplifiers IOSA are coupled to one of the data lines DL<0> to DL<7> and one of the inverting data lines DLb<0> to DLb<7>, which is paired the one data line, and may be configured to amplify the voltage difference between the data line and the inverting data line and output data to a corresponding input/output pin.

Figure 12A:
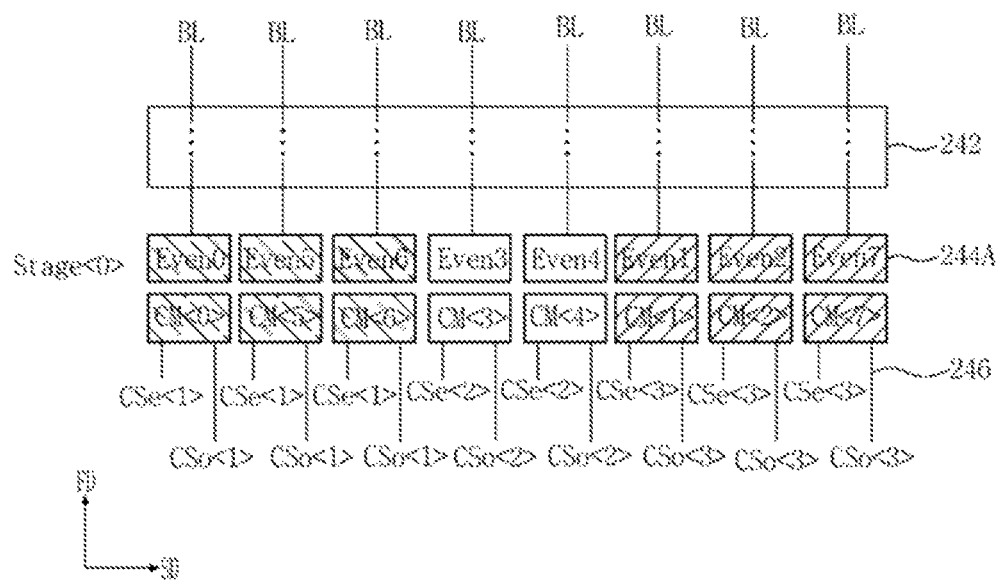
FIGS. 12A and 12B are diagrams describing a pitch change of wiring lines for transferring column select signals in accordance with an embodiment of the present invention.
Figure 12B:
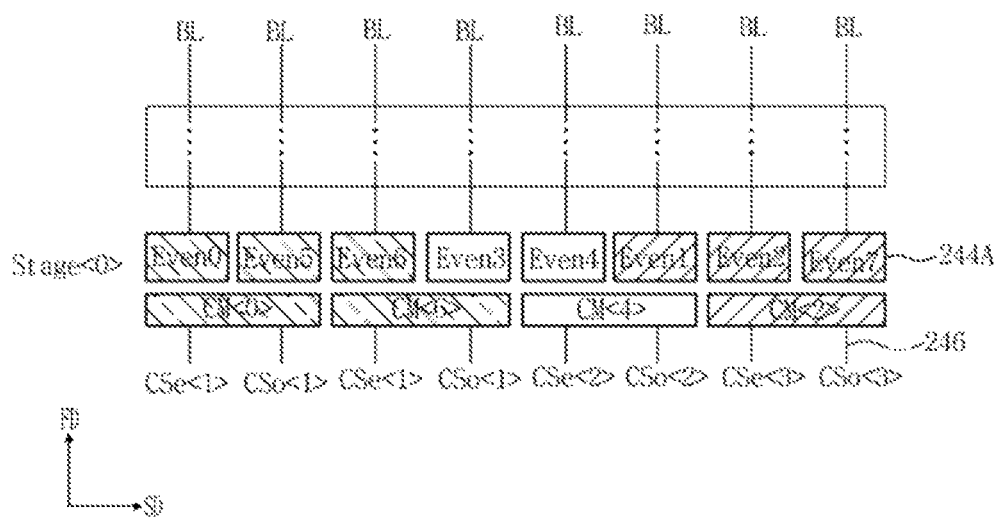

FIGS. 12A and 12B are diagrams describing a pitch change of wiring lines for transferring column select signals in accordance with an embodiment of the present invention. FIG. 12A shows a pitch change of wiring lines for transferring column select signals according to comparative method, and FIG. 12B shows a pitch change of wiring lines for transferring column select signals according to an embodiment of the present invention.

Since the cache latches 244A are disposed in the same number in respective stages in the first direction FD and the column merge units CM are disposed in the same number in the respective stages in the first direction FD, in the following descriptions to be made with reference to FIGS. 12A and 12B, only cache latches 244A disposed in one stage in the first direction FD and column merge units CM disposed in one stage in the first direction FD will be described. Referring to FIGS. 12A and 12B, each of the cache latches 244A is coupled to one bit line through one sensing latch circuit 242A (see FIG. 3). Alternatively, since two column select signals CSe and CSo should be inputted to each of the column merge units CM, two wiring lines 246 for column select signals are coupled to each of the column merge units CM to transfer the column select signals CSe and CSo.

In order to prevent the size of a memory device from being increased due to the presence of the wiring lines 246 for column select signals, it is necessary to dispose the wiring lines 246 for column select signals in conformity with the line and space widths of the bit lines BL.

As shown in FIG. 12A, the pitch of the column merge units CM in the second direction SD is the same as the pitch of the cache latches 244A in the second direction SD. In this case, the number of column merge units CM which are disposed in one stage in the first direction FD will be the same as the number of cache latches 244A which are disposed in one stage Stage<0> in the first direction FD.

Since one bit line is coupled to each of the cache latches 244A through the sensing latch section 242 and two wiring lines 246 for column select signals are coupled to each of the column merge units CM, the number of wiring lines 246 for column select signals which are coupled to the column merge units CM disposed in one stage in the first direction FD will be two times the number of bit lines BL which are coupled to the cache latches 244A disposed in the one stage Stage<0> in the first direction FD.

For example, when the number of cache latches 244A disposed in the one stage Stage<0> in the first direction FD is eight and the number of column merge units CM disposed in one stage in the first direction FD is eight, total eight bits lines BL are coupled one by one to the eight cache latches 244A disposed in the one stage Stage<0> in the first direction FD, and total 16 wiring lines 246 for column select signals are coupled two by two to the eight column merge units CM disposed in one stage in the first direction FD. Thus, when the wiring lines 246 for column select signals are disposed in conformity with the line and space widths of the bit lines BL, the pitch of the wiring lines 246 for column select signals in the second direction SD will be half the pitch of the bit lines BL in the second direction SD.

In order to increase the degree of integration of a memory device, the pitch of the bit lines BL in the second direction SD should be reduced. In this regard, if the pitch of the bit lines BL in the second direction SD is reduced, the pitch of the wiring lines 246 for column select signals in the second direction SD may become smaller than a minimum size that may be obtained by a semiconductor manufacturing process. In this case, since it becomes impossible to dispose the wiring lines 246 for column select signals in conformity with the line and space widths of the bit lines BL, it may be difficult to improve the degree of integration of a memory device.

Referring to FIG. 12B, as in the present embodiment, if the pitch of the column merge units CM in the second direction SD is greater than the pitch of the cache latches 244A in the second direction SD, the number of column merge units CM disposed in one stage in the first direction FD becomes smaller than the number of cache latches 244A disposed in the one stage Stage<0> in the first direction FD.

If the number of column merge units CM disposed in one stage in the first direction FD becomes smaller than the number of cache latches 244A disposed in the one, stage Stage<0> in the first direction FD, the number of wiring lines 246 for column select signals coupled to the column merge units CM disposed in one stage in the first direction FD will become smaller than two times the number of bit lines BL coupled to the cache latches 244A disposed in the one stage Stage<0> in the first direction FD. Thus, when the wiring lines 246 for column select signals are disposed in conformity with the line and space widths of the bit lines BL, the pitch of the wiring lines 246 for column select signals in the second direction SD will become greater than half the pitch of the bit lines BL in the second direction SD.

For example, if the pitch of the column merge units CM in the second direction SD is two times the pitch of the cache latches 244A in the second direction SD and the number of cache latches 244A disposed in the one stage Stage<0> in the first direction FD is eight, the number of column merge units CM disposed in one stage in the first direction FD becomes four. In this case, since total eight bit lines BL are coupled one by one, through the sensing latch section 242, to the eight cache latches 244A disposed in the one stage Stage<0> in the first direction FD and total eight wiring lines 246 for column select signals are coupled two by two to the four column merge units CM disposed in one stage in the first direction FD in order to dispose the wiring lines 246 for column select signals in conformity with the line and space widths of the bit lines BL, the pitch of the wiring lines 246 for column select signals in the second direction SD may be made equal to the pitch of the bit lines BL in the second direction SD. Hence, even when the pitch of the bit lines BL in the second direction SD is reduced to increase the degree of integration of a memory device, it is possible to dispose the wiring lines 246 for column select signals in conformity with the line and space widths of the bit lines BL. As a consequence, since a size increase issue due to the presence of the wiring lines 246 for column select signals is lessened, the degree of integration of a memory device may be improved.

Figure 13:
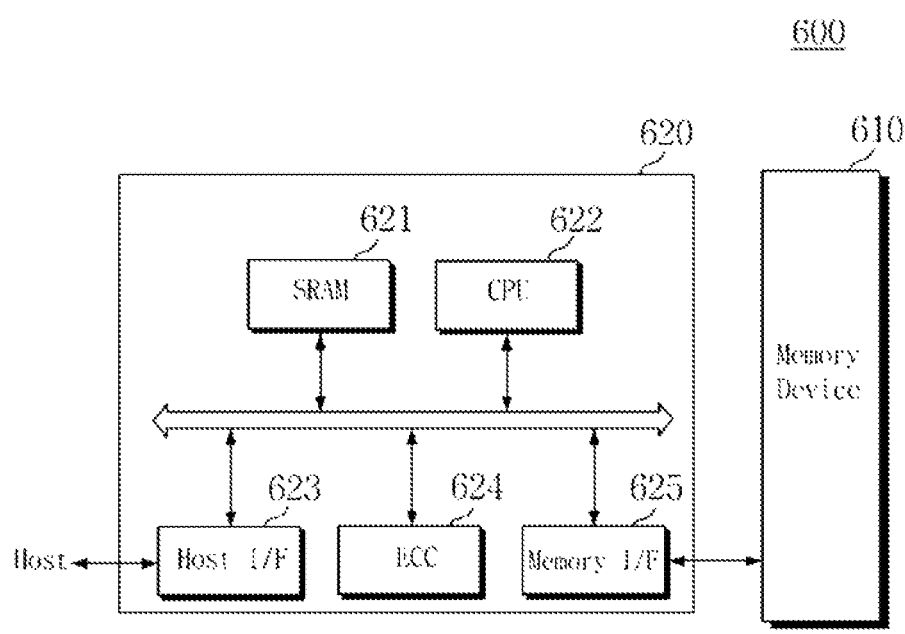
FIG. 13 is a simplified block diagram schematically illustrating a memory system including a memory device in accordance with an embodiment of the present invention.

FIG. 13 is a simplified block diagram schematically illustrating a memory system 600 including a memory device 610 according to an embodiment of the present invention.

Referring to FIG. 13, the memory system 600 may include the memory device 610 and a memory controller 620.

The memory device 610 may be comprised of a semiconductor memory device according to an embodiment of the invention as described above, and may be operated in the manner described above. The memory controller 620 may control the semiconductor memory device 610. For example, the combination of the semiconductor memory device 610 and the memory controller 620, may be configured as a memory card or a solid state disk (SSD). The memory controller 620 may include an SRAM 621, a central processing unit (CPU) 622, a host interface 623, an error correction code (ECC) block 624, a memory interface 625.

The SRAM 621 may be used as the working memory of the CPU 622. The host interface 623 may include the data exchange protocol of a host which may be coupled with the memory system 600.

The ECC block 624 may detect and correct an error included in the data read out from the semiconductor memory device 610.

The memory interface 625 may interface with the semiconductor memory device 610. The CPU 622 may perform general control operations for data exchange of the memory controller 620.

Although not shown, it should become apparent to a person skilled in the art that the memory system 600 may further be provided with a ROM which stores code data for interfacing with the host. The semiconductor memory device 610 may be provided as a multi-chip package constructed by a plurality of flash memory chips.

The memory system 600 may be used as a storage medium of high reliability having a low probability of an error occurring. The aforementioned nonvolatile memory device may be provided for a memory system such as a solid state disk (SSD). The memory controller 620 may communicate with an external device for example, the host, through one of various interface protocols such as a USB (universal serial bus) protocol, an MMC (multimedia card) protocol, a PCI-E (peripheral component interconnection express) protocol, an SATA (serial advanced technology attachment) protocol, a RATA (parallel advanced technology attachment) protocol, an SCSI (small computer system interface) protocol, an ESDI (enhanced small disk interface) protocol and an IDE (integrated device electronics) protocol and the like.

Figure 14:
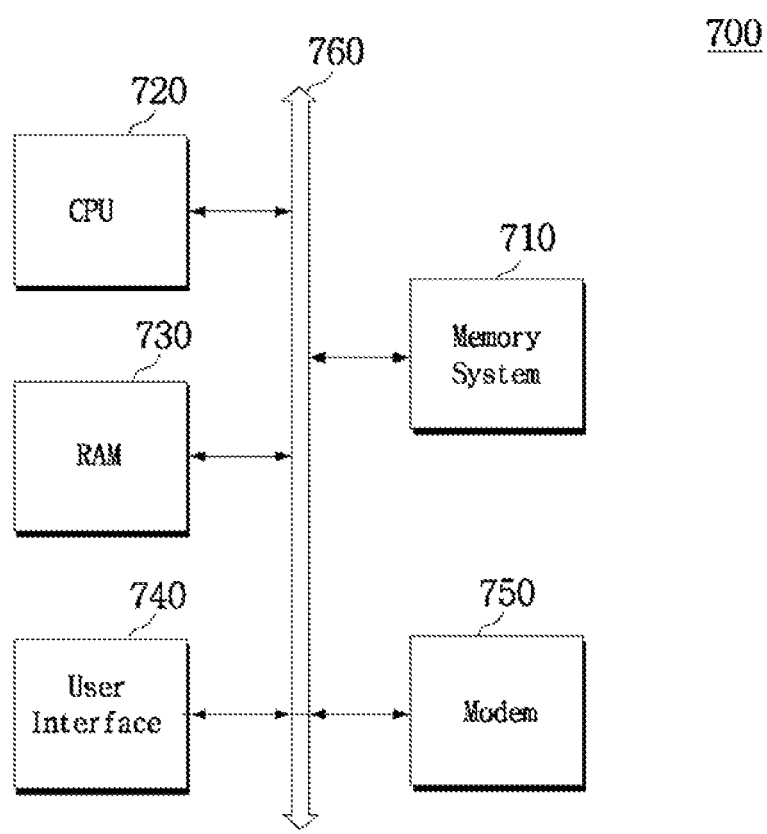
FIG. 14 is a simplified block diagram schematically illustrating a computing system including a memory device, according to an embodiment of the present invention.

FIG. 14 is a simplified block diagram schematically illustrating a computing system 700 including a memory system 710, according to an embodiment of the present invention.

Referring to FIG. 14, the computing system 700 according to an embodiment may include the memory system 710, a microprocessor (or CPU) 720, a RAM 730, a user interface 740, a modern 750 such as a baseband chipset, and, which are electrically coupled to a system bus 760. In an embodiment, the memory system 710 may be comprised of a semiconductor memory device according to an embodiment of the invention as described above. The computing system 700 may be a mobile device, in which case a battery (not shown) for supplying the operating voltage of the computing system 700 may be additionally provided. Although not shown in the drawing, it should become apparent to a person skilled in the art that the computing system 700 may further comprise an application chipset, a CMOS image sensor (CIS), a mobile DRAM, and so on. The memory system 710 may be configured, for example, as an SSD (solid state drive/disk) which uses a nonvolatile memory to store data. Also as an example, the memory system 710 may be provided as a fusion flash memory (for example, a NAND or a NOR flash memory).

The above-described embodiments may be realized not only by a device and a method, the embodiments may also be realized by a program which performs a function corresponding to the configuration of each embodiment or a recording medium on which the program is recorded. Such realization may be easily derived from the descriptions of the above-described embodiments by a person skilled in the art to which the embodiments pertain.

Although various embodiments have been described for illustrative purposes, it will be apparent to those skilled in the art that various changes and modifications may be made without departing from the spirit and scope of the invention as defined in the following claims.

What is claimed is:

1. A memory device comprising:
    a memory cell array;
    bit lines including a plurality of even bit lines and a plurality of odd bit lines, which extend in a first direction and are alternately disposed;
    cache latches including a plurality of even cache latches which exchange data with the memory cell array through the even bit lines and a plurality of odd cache latches which exchange data with the memory cell array through the odd bit lines;
    $2^k$ number of data lines, where k is a natural number equal to or greater than 2, respectively corresponding to $2^k$ number of input/output pins; and
    a plurality of column merge units respectively allocated to the input/output pins, and each suitable for coupling any one of the even cache latches or any one of the odd cache latches to a data line corresponding to an allocated input/output pin,
    wherein a pitch of the column merge units in a second direction intersecting the first direction is greater than a pitch of the cache latches in the second direction.

2. The memory device according to claim 1, wherein the cache latches are disposed in the first direction and the second direction, and have a two-dimensional arrangement of M stages in the first direction, M being a natural number different from $2^n$ and is equal to or greater than 3, and n being a natural number.

3. The memory device according to claim 2,
    wherein each of the cache latches is allocated to any one of the input/output pins,
    wherein the cache latches form a plurality of input/output cache latch groups each of which includes $2^k$ number of cache latches allocated to the input/output pins, and
    wherein the cache latches included in each of the input/output cache latch groups have a two-dimensional arrangement in the first direction and the second direction.

4. The memory device according to claim 3, wherein the input/output cache latch groups comprise:
    a plurality of even input/output cache latch groups each including $2^k$ number of even cache latches which are respectively coupled to $2^k$ number of even bit lines and are respectively allocated to the input/output pins; and
    a plurality of odd input/output cache latch groups each including $2^k$ number of odd cache latches which are respectively coupled to $2^k$ number of odd bit lines and are respectively allocated to the input/output pins.

5. The memory device according to claim 4,
    wherein, among the even input/output cache latch groups and the odd input/output cache latch groups, an even input/output cache latch group and an odd input/output cache latch group, which are respectively coupled to $2^k$ number of even bit lines and $2^k$ number of odd bit lines disposed adjacent to each other, form one cache latch group, and
    wherein cache latches included in the one cache latch group have a two-dimensional arrangement.

6. The memory device according to claim 4, wherein a pair of even cache latch and odd cache latch, which are allocated in common to any one of the input/output pins and are included in the same cache latch group, are disposed to be adjacent to each other in the first direction in the two-dimensional arrangement.

7. The memory device according to claim 6, wherein the pair of even cache latch and odd cache latch are coupled in common to one of the column merge units.

8. The memory device according to claim 7, wherein each of the column merge units comprises:
    a first switch transistor coupled between a data line corresponding to the allocated input/output pin and a non-inverted output of the even cache latch, and suitable for coupling the non-inverted output of the even cache latch to the data line in response to an even column select signal inputted to a gate thereof; and
    a second switch transistor coupled between the data line and a non-inverted output of the odd cache latch, and suitable for coupling the non-inverted output of the odd cache latch to the data line in response to an odd column select signal inputted to a gate thereof.

9. The memory device according to claim 8,
    wherein the column merge units have a two-dimensional arrangement in the first direction and the second direction, and
    wherein, when column merge units disposed adjacent to each other in the second direction are coupled to the even and odd cache latches included in the same cache latch group, gates of first switch transistors in the column merge units disposed adjacent to each other are coupled in common, and gates of second switch transistors in the column merge units disposed adjacent to each other are coupled in common.

10. The memory device according to claim 7, further comprising:
    $2^k$ number of inverting data lines respectively corresponding to the input/output pins; and
    a plurality of inverting column merge units respectively allocated to the input/output pins, and each suitable for coupling any one of the even cache latches or any one of the odd cache latches to an inverting data line corresponding to the allocated input/output pin.

11. The memory device according to claim 10, wherein the pair of even cache latch and odd cache latch are coupled in common to one of the inverting column merge units.

12. The memory device according to claim 11, wherein each of the inverting column merge units comprises:
    a third switch transistor coupled between an inverting data line corresponding to the allocated input/output pin and an inverted output of the even cache latch, and suitable for coupling the inverted output of the even cache latch to the inverting data line in response to an even column select signal inputted to a gate thereof; and a fourth switch transistor coupled between the inverting data line and an inverted output of the odd cache latch, and suitable for coupling the inverted output of the odd cache latch to the inverting data line corresponding to the allocated input/output pin in response to an odd column select signal inputted to a gate thereof.

13. The memory device according to claim 12,
wherein the inverting column merge units have a two-dimensional arrangement in the first direction and the second direction, and
wherein, when inverting column merge units disposed adjacent to each other in the second direction are coupled to the even and odd cache latches included in the same cache latch group, gates of third switch transistors included in the inverting column merge units disposed adjacent to each other are coupled in common, and gates of fourth switch transistors included in the inverting column merge units disposed adjacent to each other are coupled in common.

14. The memory device according to claim 13, wherein a column merge unit and an inverting column merge unit, which are allocated in common to one of the input/output pins, are disposed to be adjacent to each other in the first direction.

15. The memory device according to claim 10, further comprising:
an input/output circuit including a plurality of input/output sense amplifiers which respectively correspond to the input/output pins, and each of which is suitable for generating data by amplifying a voltage difference between a data line and an inverting data line allocated in common to one of the input/output pins and outputting the data to the corresponding input/output pin.

16. A memory device comprising:
a memory cell array;
a plurality of bit lines coupled to the memory cell array and including a plurality of even bit lines and a plurality of odd bit lines, which extend in a first direction and are alternately disposed;
$2^k$ number of data lines where k is a natural number equal to or greater than 2, respectively corresponding to $2^k$ number of input/output pins;
an even cache latch group including $2^k$ number of cache latches which are respectively coupled to $2^k$ number of the even bit lines and are respectively allocated to the input/output pins;
an odd cache latch group including $2^k$ number of cache latches which are respectively coupled to $2^k$ number of the odd bit lines and are respectively allocated to the input/output pins; and
a plurality of column merge units respectively allocated to the input/output pins, and suitable for coupling the $2^k$ number of cache latches included in the even cache latch group or the $2^k$ number of cache latches included in the odd cache latch group, to the data lines, in response to column select signals,
wherein the cache latches of the even cache latch group and the odd cache latch group have a two-dimensional arrangement in the first direction and a second direction intersecting the first direction, and
wherein a pitch of the column merge units in the second direction is greater than a pitch of the cache latches in the second direction.

17. The memory device according to claim 16, wherein an even cache latch and an odd cache latch, which are allocated to one of the input/output pins, are coupled in common to one of the column merge units.

18. The memory device according to claim 16,
wherein the column merge units have a two-dimensional arrangement in the first direction and the second direction,
wherein the column merge units have a two-dimensional arrangement of a plurality of stages in the first direction,
wherein the number of column merge units disposed in each of the stages is smaller than the number of cache latches disposed in each stage in the first direction.

19. The memory device according to claim 18,
wherein the column select signals include even column select signals for coupling the cache latches of the even cache latch group to the data lines and odd column select signals for coupling the cache latches of the odd cache latch group to the data lines, and
wherein two wiring lines for transferring one column select signal including one even column select signal and one odd column select signal are coupled to each of the column merge units.

20. The memory device according to claim 19, wherein a pitch of wiring lines for transferring the column select signals, which are coupled to column merge units disposed in each of the stages in the first direction, is greater than half a pitch of bit lines coupled to cache latches disposed in each of the stages in the first direction.

* * * * *